United States Patent
Kamitani

[11] Patent Number: 6,127,828
[45] Date of Patent: Oct. 3, 2000

[54] APPARATUS FOR MEASURING RESISTANCE OF ELECTRONIC COMPONENT

[75] Inventor: Gaku Kamitani, Otsu, Japan

[73] Assignee: Murata Manufacturing Co., Ltd., Japan

[21] Appl. No.: 09/074,177

[22] Filed: May 7, 1998

[30] Foreign Application Priority Data

| May 9, 1997 | [JP] | Japan | 9-135814 |
| Dec. 2, 1997 | [JP] | Japan | 9-348616 |

[51] Int. Cl.$^7$ ................................................. G01R 31/12

[52] U.S. Cl. .......................... 324/548; 324/537; 324/765

[58] Field of Search ................................. 324/548, 519, 324/522, 523, 551, 679, 680, 606, 706; 340/635, 647

[56] References Cited

U.S. PATENT DOCUMENTS

| 3,930,993 | 1/1976 | Best et al. ............................. 209/551 |
| 4,954,782 | 9/1990 | Ball ......................................... 324/538 |
| 4,985,672 | 1/1991 | Hashimoto et al. .................... 324/537 |
| 5,262,729 | 11/1993 | Kawabata et al. .................... 324/548 |
| 5,508,607 | 4/1996 | Gibson ................................. 324/121 R |
| 5,959,463 | 9/1999 | Funakura et al. ....................... 324/765 |
| 5,969,752 | 10/1999 | Belter ..................................... 348/125 |

FOREIGN PATENT DOCUMENTS

| 0734088 | 9/1996 | European Pat. Off. . |
| 4131770 | 5/1992 | Japan . |
| 4254769 | 9/1992 | Japan . |

OTHER PUBLICATIONS

O. Ishihara, et al., "A Highly Stablilized GAAS Fet Oscillator Using a Dielectric Resonator Feedback Circuit in 9–14 GHZ" IEEE Transactions on Microwave Theory and Techniques., vol. 28, No. 8, Aug. 1980, pp. 817–824, XP002105727 New York, US.

Bianchi, et al. "A Simple and Accurate Model for a Dielectric Resonator Symmetrically Coupled With Two Microstrips" Proceedings of the European Microwave Conference, London, Sep. 4–7, 1989, 1189–1194, XP000067395, Microwave Exhibitions and Publications Ltd; and.

Patent Abstracts of Japan, vol. 7, No. 132 (E–180), Jun. 9, 1983 & JP 58 047302 A (Matsushita Denki Sangyo KK), Mar. 19, 1983.

*Primary Examiner*—Safet Metjahic
*Assistant Examiner*—Anjan K Deb
*Attorney, Agent, or Firm*—Ostrolenk, Faber, Gerb & Soffen, LLP

[57] ABSTRACT

An apparatus for measuring the insulation resistance of an electronic component, such as a capacitor 5, capable of reliable detection of contact even for an electronic component having a small capacitance, in which the capacitor 5 is retained in a retaining groove 21 on a turn table 20. Contact electrodes 13*a* and 13*b* are provided on the bottom of the retaining groove 21, and a dummy capacitor 12 is connected to the contact electrodes 13*a* and 13*b* is secured to the rear surface of the turn table 20. Measuring terminals 7*a* and 7*b* are put in contact with electrodes of the capacitor 5, and an AC current is applied to detect contact from the output thereof. After the detection of contact, a DC voltage is applied from the measuring terminals 7*a* and 7*b*, and the insulation resistance of the capacitor 5 is obtained by detecting a leakage current therefrom.

6 Claims, 5 Drawing Sheets

APPARATUS FOR MEASURING RESISTANCE OF ELECTRONIC COMPONENT

BACKGROUND OF THE INVENTION

1. Field of the Invention

The present invention relates to an apparatus for measuring the resistance of an electronic component and, more particularly, to an apparatus suitable for the measurement of the resistance of an electronic component having a small capacity and high resistance.

2. Description of the Related Art

When the resistance of an electronic component such as a capacitor is measured, measuring terminals must be put in contact with electrodes of the electronic component to be tested. A measured value will not indicate the resistance correctly if there is poor contact between the measuring terminals and the electrodes of the electronic component. However, for an electronic component having very high resistance, it is difficult to distinguish the state of poor contact from a normal state.

Insulation resistance measuring apparatuses capable of detecting the contact of the measuring terminals and measuring insulation resistance as shown in FIG. 1 are known (for example, see Japanese unexamined patent publication No. H4-131770). Specifically, 1 and 2 respectively designate a sine wave generator and a DC measuring power supply which are each grounded at one end thereof and one of which is selected by a switch 3 at the other end thereof. The switch 3 is connected to one end of a capacitor 5 to be tested through a current limiting resistor 4, and the other end of the capacitor 5 is connected to an input of an amplifier 6. Measuring terminals 7a and 7b are in contact with electrodes on both ends of the capacitor 5. The output of the amplifier 6 is connected through a switch 8 to an A-D converter 9 which is connected to an analyzer (CPU) 10. The output of the amplifier 6 is also connected to the switch 8 through an RMS-DC converter 11. When the switch 8 is switched to the position of the amplifier, the amplifier 6 is directly connected to the A-D converter 9 and, when the switch 8 is switched to the position of the RMS-DC converter, the amplifier 6 is connected to the A-D converter 9 through the RMS-DC converter 11.

A description will now be made on a method of measuring the insulation resistance of the capacitor 5 to be tested using the measuring apparatus described above.

First, in order to confirm that the capacitor 5 is in proper contact with the measuring terminals 7a and 7b, the switch 3 is switched to the position of the sine wave generator 1 to apply an AC signal having a frequency on the order of, for example, 1 kHz. At the same time, the switch 8 is switched to the position of the RMS-DC converter 11. As a result, the AC signal flows through the capacitor 5, is amplified by the amplifier 6, and is then converted by the RMS-DC converter 11 into a DC signal which corresponds to the RMS value. The DC signal is digitized by the A-D converter 9 and is analyzed by the CPU 10. When this digitized signal is below a reference, it indicates poor contact.

If there is proper contact, the switch 3 is then switched to the position of the DC power supply 2, and the switch 8 is switched to the position of the amplifier 6 at the same time. As a result, the capacitor 5 is charged by a current which is limited by the current limiting resistor 4. After the charging, any leakage current from the capacitor 5 is amplified by the amplifier 6; the output of the amplifier 6 is digitized by the A-D converter 9; and the output of the A-D converter 9 is analyzed by the CPU 10 to calculate the insulation resistance of the capacitor 5.

According to the above-described method of detecting contact, the contact between the measuring terminals 7a and 7b and the capacitor 5 is detected by detecting the capacity of the capacitor 5 by applying an AC signal thereto. However, the detection of contact based on the detection of the capacity as described above has a problem in that reliable detection of contact can not be performed when the tested element 5 has a very small or no capacity.

It is therefore an object of the present invention to provide an apparatus for measuring the resistance of an electronic component capable of reliable detection of contact even for an electronic component to be tested having a small capacity.

SUMMARY OF THE INVENTION

In order to achieve the above-described object, according to the present invention, in an apparatus for measuring the resistance of an electronic component by putting measuring terminals in contact with electrodes of the electronic component to detect a current flowing through the electronic component, a dummy capacitor having an electrostatic capacity required for the detection of contact is provided such that electrodes thereof can be put in contact with the electrodes of the electronic component, and the electrodes of the dummy capacitor are put in contact with the electrodes of the electronic component at the same time when the measuring terminals are put in contact with the electronic component to detect a current flowing through a parallel circuit formed by the electronic component and the dummy capacitor.

When the measuring terminals are urged against the electrodes of the electronic component, the electrodes of the electronic component also contact the electrodes of the dummy capacitor. When a DC signal or AC signal is applied from the measuring terminal at this point, since the signal flows through the parallel circuit formed by the electronic component and the dummy capacitor, an output signal corresponding to the capacity of the parallel circuit can be obtained. The capacity of the parallel circuit is given by the sum of the capacity of the electronic component and the capacity of the dummy capacitor. Therefore, if the dummy capacitor has a sufficient capacity, reliable detection of contact can be performed even if the capacity of the electronic component is small because the parallel circuit can provide a sufficient output.

When the measuring terminals and the electrodes of the electronic component are not in contact, it is possible to detect the lack of contact reliably because the dummy capacitor is also not in contact.

Further, even if there is preferable contact between the measuring terminals and the electrodes of the electronic component, the contact between the dummy capacitor electrodes and the electrodes of the electronic component may fail. In this case, the parallel circuit provides an output which corresponds only to the capacity of the electronic component and which is therefore so small that the failed contact can be detected easily.

By continuing the measurement of resistance after the detection of contact as described above with the electrodes of the electronic component and the measuring terminals kept in contact, the resistance of the electronic component can be measured accurately. In this case, although the measured resistance is the resistance of the parallel circuit, the resistance of the electronic component can be easily obtained using a predetermined equation because the insulation resistance of the dummy capacitor is known.

The signal applied for the detection of contact may be either DC or AC signal. When a DC signal is applied, since a rush current flows through the parallel circuit formed by the electronic component and dummy capacitor at the beginning of the application, the detection of contact can be carried out by detecting this rush current. When an AC signal is applied, since an AC current flows through the parallel circuit formed by the electronic component and dummy capacitor, the detection of contact can be carried out by detecting this AC current. In either case, since an output signal corresponding to the capacity of the parallel circuit is obtained, contact can be detected from the output signal.

In many cases, actual measurement of insulation resistance is carried out using a transporting device such as a turn table. The present invention may be applied to such a transporting device.

Specifically, according to an aspect of the invention, there is provided a transporting device driven for rotation in one direction, a retaining groove for containing and retaining an electronic component provided on an upper surface of the transporting device, and a pair of contact electrodes provided on the bottom of the retaining groove such that they can contact with electrodes of the electronic component; the measuring terminals are provided above the transporting device such that they can be elevated and lowered; the dummy capacitor is integrally incorporated in the transporting device; and the contact electrodes and the electrodes of the dummy capacitor are connected to each other. Such a configuration allows the measurement of contact to be carried out during transportation to improve productivity with a small apparatus.

Similarly, according to another aspect of the invention, there is provided a transporting device driven for rotation in one direction, a retaining groove for containing and retaining an electronic component provided on an upper surface of the transporting device, a pair of contact electrodes provided on the bottom of the retaining groove such that they can contact with electrodes of the electronic component and extended to a lower surface of the transporting device, and an urging device provided above the transporting device such that it can be elevated and lowered, for urging the electronic component contained in the retaining groove to put electrodes of the electronic component in contact with the contact electrodes; the measuring terminals are provided under the transporting device such that they can contact the contact electrodes; the dummy capacitor is integrally incorporated in the urging device; and the terminals thereof can contact the electrodes of the electronic component. In this case, the same effect as described above can be achieved by providing the dummy capacitor within the urging device.

Electronic components covered by the present invention are not limited to capacitors, and the present invention may be used for components having no capacity such as resistors and for the measurement of the resistance of a switch or relay in an open state.

The transporting device may be a turn table having retaining grooves for retaining electronic components provided on its circumference at equal pitches or may be an endless belt having retaining grooves for retaining electronic components provided at equal pitches.

DETAILED DESCRIPTION OF PREFERRED EMBODIMENTS

Figure 1:
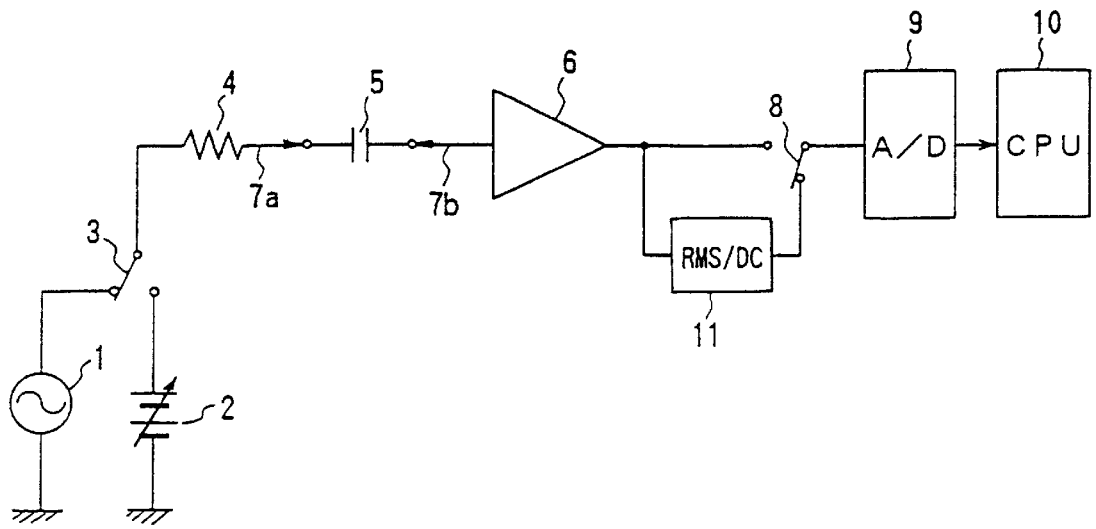
FIG. 1 is a circuit diagram of an example of a conventional apparatus for measuring the insulation resistance of a capacitor.

The principle of the method of measuring resistance of the present invention will be described with reference to FIGS. 2 and 3. A chip capacitor 5 is used here as an electronic component to be measured for simplicity of description. Parts in FIG. 2 identical to those in FIG. 1 are indicated by like reference numbers and will not be described to avoid duplication.

Reference numeral 12 designates a dummy capacitor which is a capacitor having a capacitance Cd greater than that of the capacitor 5 to be measured. The dummy capacitor 12 must have a capacitance required for the detection of contact and preferably has a capacitance of, for example, 1 pF or more. Contact electrodes 13a and 13b are connected to electrodes 12a and 12b on both sides of the dummy capacitor 12 in advance, and the contact electrodes 13a and 13b can contact electrodes 5a and 5b of the capacitor 5 to be measured. Further, measuring terminals 7a and 7b can contact the electrodes 5a and 5b of the capacitor 5 to be measured as in the prior art. When the electrodes 5a and 5b of the capacitor 5 to be measured are in conduction to the measuring terminals 7a and 7b and to the contact electrodes 13a and 13b, the dummy capacitor 12 and the capacitor 5 to be measured are connected in parallel.

Figure 3:
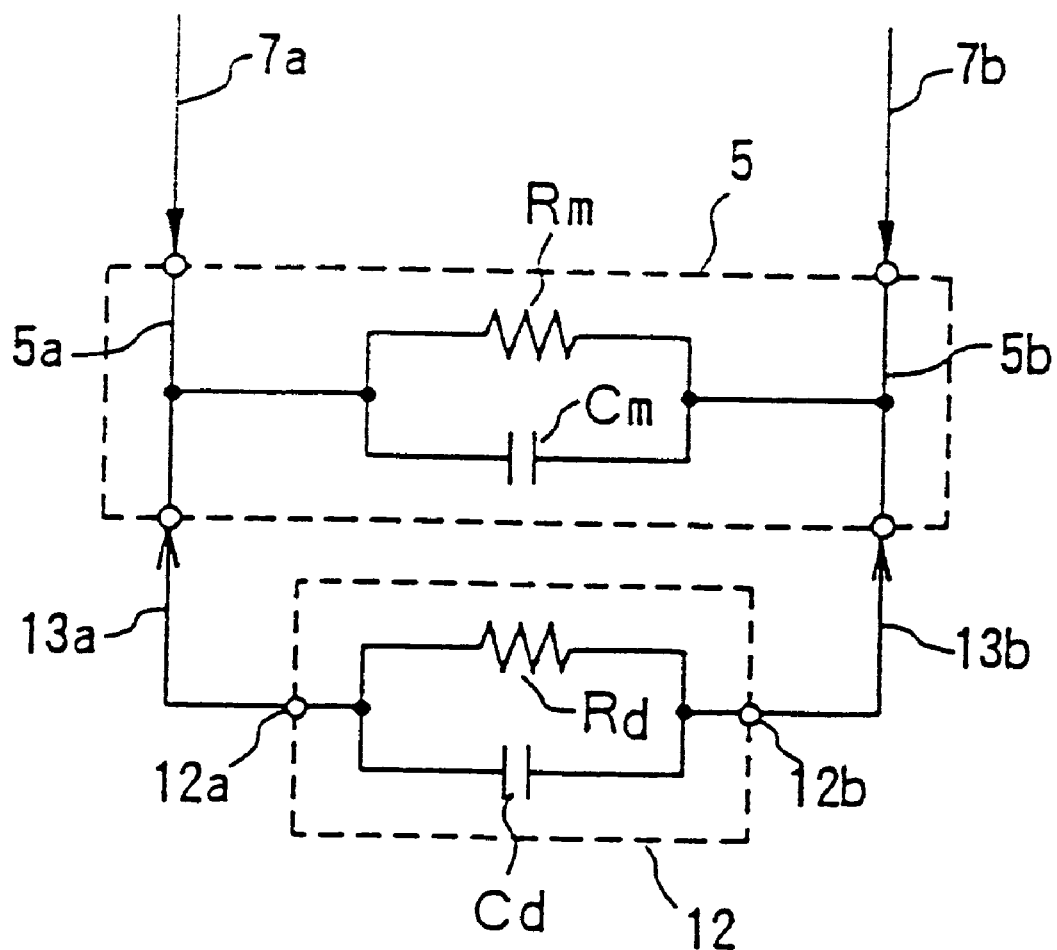
FIG. 3 is an equivalent circuit diagram of major parts of the apparatus for measuring resistance in FIG. 2.

As shown in the equivalent circuit in FIG. 3, the capacitor 5 comprises an insulation resistor Rm and an electrostatic capacitance Cm, and the capacitor 12 comprises an insulation resistor Rd and an electrostatic capacitance Cd.

A description will now be made on a method of detecting contact and a method of measuring resistance.

First, the measuring terminals 7a and 7b are urged into contact with the electrodes 5a and 5b of the capacitor 5 to be measured. The urging force also puts the electrodes 5a and 5b of the capacitor 5 to be measured in contact with the contact electrodes 13a and 13b which are connected to the electrodes 12a and 12b of the dummy capacitor 12. Then, a switch 3 is switched to the position of a sine wave generator 1 to apply an AC signal at a frequency on the order of, for example, 1 kHz. At the same time, a switch 8 is switched to the position of an RMS-DC converter 11. As a result, the AC signal flows through the parallel circuit formed by the capacitor 5 and the dummy capacitor 12, is amplified by an amplifier 6 and is thereafter converted by the RMS-DC converter 11 into a DC signal corresponding to the RMS value. Then, this DC signal is digitized by an A-D converter 9 and the resultant signal can be analyzed by a CPU 10 to detect whether there is proper contact between the measuring terminals 7a and 7b and the electrodes 5a and 5b of the capacitor 5 to be measured.

If there is proper contact, the switch 3 is then switched to the position of a DC power supply 2 and, at the same time, the switch 8 is switched to the position of the amplifier 6. As a result, a current which has been limited by a current limiting resistor 4 is charged in the parallel circuit formed by the capacitor 5 to be measured and the dummy capacitor 12. After the charging, any leakage current from the parallel circuit is amplified by the amplifier 6, and the resultant output is analyzed by the CPU 10 after being digitized by the A-D converter 9 to calculate the insulation resistance Rm of the capacitor 5 to be measured.

Since the capacitors 5 and 12 are connected to each other in parallel, as apparent from FIG. 3, the capacitance C and the resistance R of the parallel circuit are as shown below.

$$C = Cm + Cd \qquad \text{Equation 1}$$

$$R = Rm \cdot Rd/(Rm + Rd) \qquad \text{Equation 2}$$

As apparent from Equation 1, the dummy capacitor 12 has a function of maintaining the capacity C required for detecting contact, and reliable detection of contact can be carried out even if the capacitance Cm of the capacitor 5 to be measured is small.

Equation 2 can be changed to the following equation which gives the insulation resistance Rm of the capacitor 5 to be measured.

$$Rm = R \cdot Rd/(Rd - R) \qquad \text{Equation 3}$$

IF Rm and Rd in Equation 2 or 3 are substantially the same or $Rm \ll Rd$, the insulation resistance Rm of the capacitor 5 to be measured can be obtained from the measured value R. When $Rm \gg Rd$, however, it is difficult to obtain the insulation resistance Rm accurately. It is therefore necessary to use a capacitor having sufficiently high insulation resistance Rd as the dummy capacitor 12. For example, the insulation resistance Rd of the dummy capacitor 12 is preferably equal to or higher than one-tenth the insulation resistance Rm of the capacitor 5 to be measured.

Figure 4:
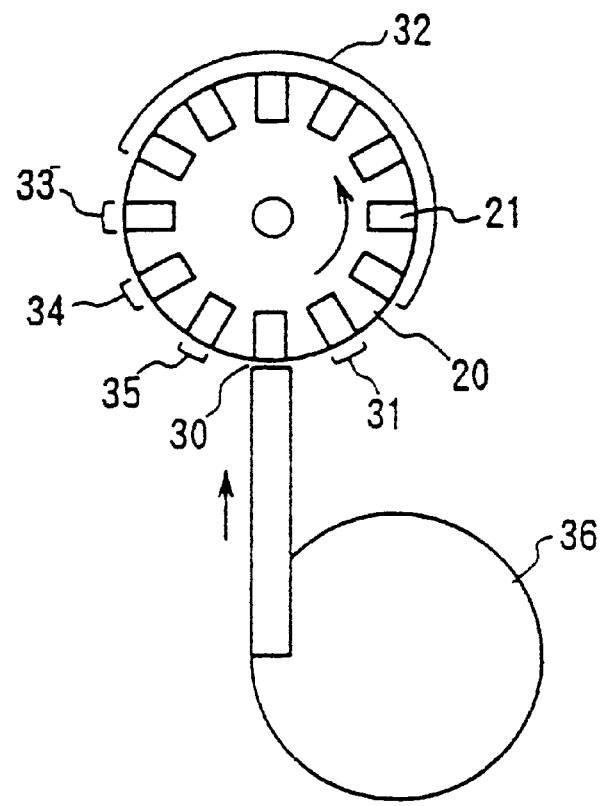
FIG. 4 is a schematic plan view of an embodiment of an apparatus for measuring resistance according to the present invention.
Figure 5:
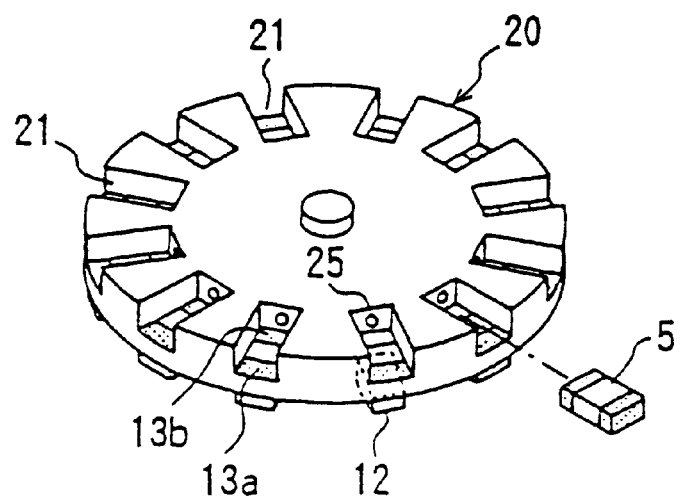
FIG. 5 is a perspective view of the turn table used in the apparatus for measuring resistance in FIG. 4.
Figure 6:
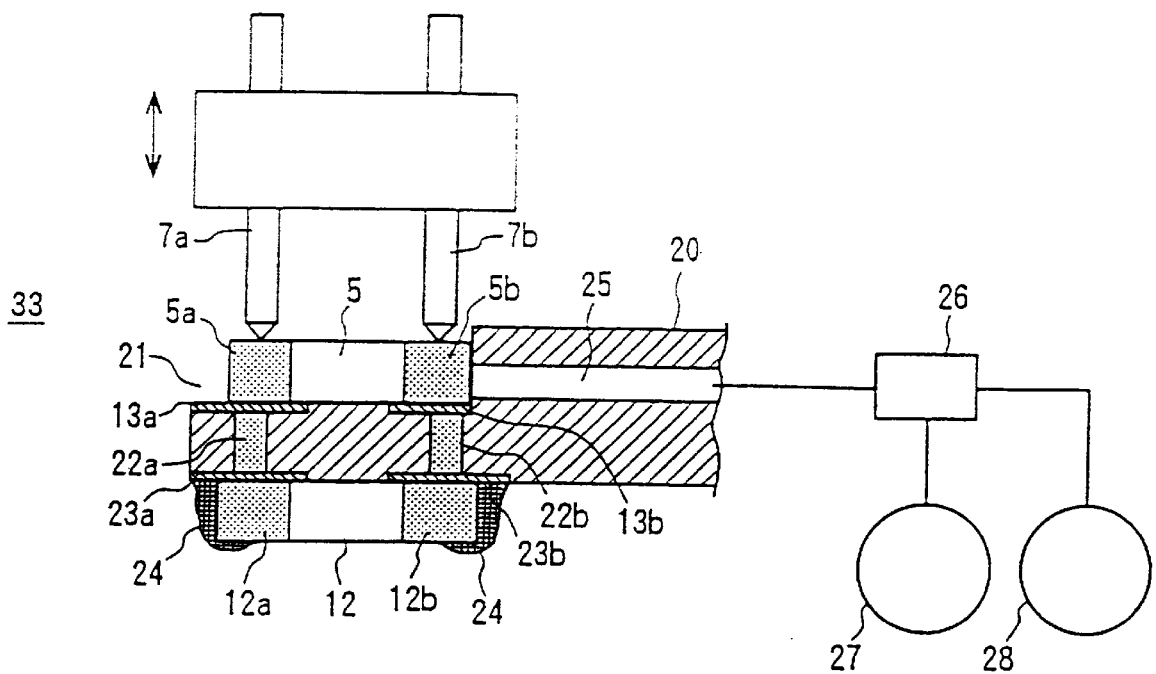
FIG. 6 is a sectional view of an IR measuring portion of the apparatus for measuring resistance in FIG. 4.

FIGS. 4 through 6 show a specific example of an apparatus for measuring resistance.

Reference numeral 20 designates a turn table which is an example of the transporting device, and the turn table 20 is intermittently driven for rotation at constant pitches in the direction of the arrow. As shown in FIG. 5, concave retaining grooves 21 each capable of retaining one chip type capacitor 5 to be tested are provided on the outer circumference of the turn table 20 at the same pitches as the above-described driving pitches. As shown in FIG. 6, two contact electrodes 13a and 13b are formed on the bottom of each of the retaining grooves 21 of the turn table 20 and are connected to rear side electrodes 23a and 23b via through hole electrodes 22a and 22b. A dummy capacitor 12 is secured across the rear side electrodes 23a and 23b which are connected to the electrodes 12a and 12b through solder or conductive adhesive 24 or the like.

As shown in FIG. 6, an air vent 25 is provided on the inner circumferential surface of each retaining groove 21, and each air vent 25 is connected to a negative pressure source 27 and a positive pressure source 28 through a change-over valve 26. While the capacitor 5 is contained in the retaining groove 21, the air vent 25 is connected to the negative pressure source 27 to retain the capacitor 5 on the inner circumferential surface of the retaining groove 21 by means of suction. As a result, the measuring terminals 7a and 7b contact the electrodes 5a and 5b of the capacitor 5 in fixed positions to allow stable measurement of characteristics and to prevent the capacitor 5 from coming out of the retaining groove 21 due to a centrifugal force produced by the rotation of the turn table 20. When the capacitor 5 is removed from the retaining groove 21, the change-over switch 26 is switched to the position of the positive pressure source 28 to blow air to eject the capacitor 5 from the retaining groove 21.

The turn table 20 is surrounded by a supply portion 30 for supplying capacitors 5 to the retaining grooves 21, a capacity measuring portion 31 for measuring the capacity, a precharge portion 32 for applying a DC voltage to the capacitors 5, an IR measuring portion 33, a defective parts ejecting portion 34, and a good parts unloading portion 35. A supply device 36 such as a parts feeder is provided in a position associated with the supply portion 30 for feeding the capacitors 5 to the turn table 20 one by one. Further, measuring terminals which can be elevated and lowered as shown in FIG. 6 are provided above the path that extends from the capacity measuring portion 31 through the precharge portion 32 to the IR measuring portion 33. Since a capacity C measured at the capacity measuring portion 31 is the capacity of a parallel circuit formed by a capacitor 5 to be measured and the dummy capacitor 12, the capacity Cm of the capacitor 5 to be measured can be easily obtained from Equation 1.

After precharging is completed at the precharge portion 32, a capacitor 5 to be measured is contacted by the measuring terminals 7a and 7b at the IR measuring portion 33. At this point, the detection of contact is first performed using the circuit shown in FIG. 2. If it is determined that there is proper contact, the measurement of the insulation resistance follows. Since the insulation resistance R is the insulation resistance of the parallel circuit formed by the capacitor 5 to be measured and the dummy capacitor 12, the insulation resistance Rm of the capacitor 5 to be measured can be obtained from Equation 3.

If either capacitance Cm or insulation resistance Rm of a capacitor 5 to be measured obtained as described above is out of a reference range, the capacitor is ejected from the defective parts ejecting portion 34. If both the capacitance Cm and insulation resistance Rm are within the reference range, the capacitor is unloaded at the good parts unloading portion 35.

Figure 7:
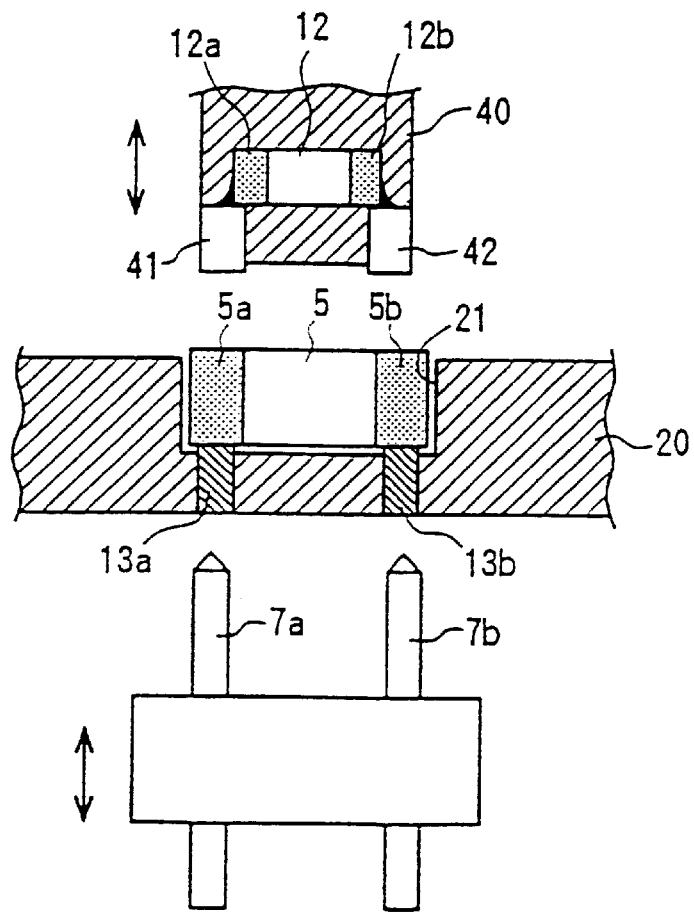
FIG. 7 is a sectional view of another embodiment of an IR measuring portion of an apparatus for measuring resistance.

FIG. 7 shows a second embodiment of the IR measuring portion 33.

In the second embodiment, the contact electrodes 13a and 13b formed on the bottom of the retaining groove 21 are extended to the bottom surface of the turn table 20 to put the measuring terminals 7a and 7b into contact with the contact terminals 13a and 13b from under. Further, an urging device 40 can be urged against the electrodes 5a and 5b of the capacitor 5 contained in the retaining groove 21 from above. The dummy capacitor 12 is buried and secured in the urging device 40, and terminals 12a and 12b of the dummy capacitor 12 are connected to terminals 41 and 42 protruding from the lower surface of the urging device 40.

During measurement, the measuring terminals 7a and 7b are elevated and the urging device 40 is lowered simultaneously. As a result, the terminals 41 and 42 contact the electrodes 5a and 5b of the capacitor 5 at the same time as the measuring terminals 7a and 7b contact the contact electrodes 13a and 13b. Such a clamping action from above and under provides reliable contact. The method for detecting contact and measuring insulation resistance is the same as described above with reference to the previous embodiment.

The dummy capacitor according to the present invention is not limited to a chip type capacitor as in the embodiment, and a capacitor having leads may be used. Therefore, the concept of electrodes in the context of the present invention implies terminals.

Figure 8:
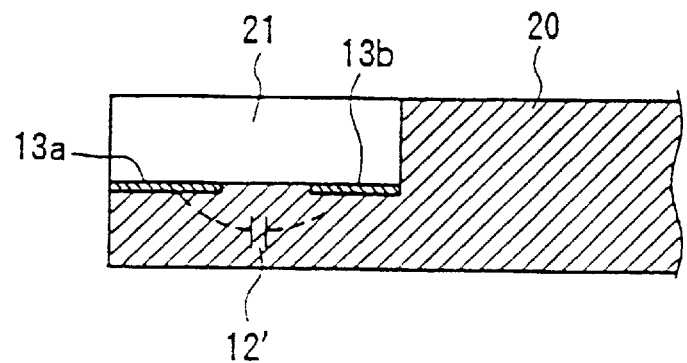
FIG. 8 is a sectional view of another embodiment of a turn table.

Further, it is not essential to provide the dummy capacitor as a separate component, and a dummy capacitor may be constituted by a transporting device (e.g., turn table) itself. For example, as shown in FIG. 8, a turn table 20 may be formed from a material having a predetermined dielectric constant, and contact electrodes 13a and 13b may be formed on the bottom of a retaining groove 21 at a predetermined interval from each other to form a dummy capacitor 12' between the contact electrodes 13a and 13b. In this case, the contact electrodes 13a and 13b may be eliminated.

Figure 2:
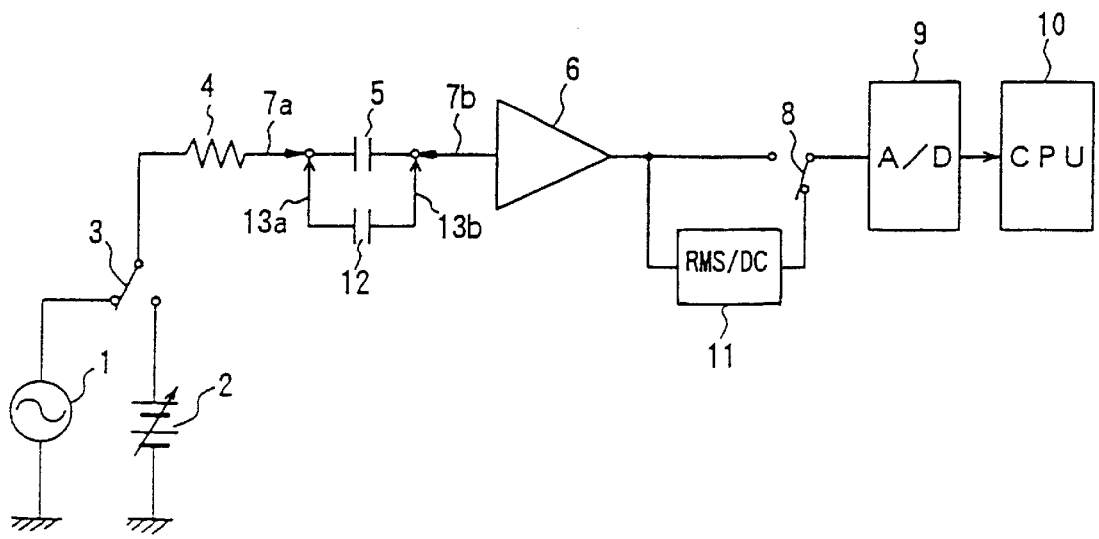
FIG. 2 is a circuit diagram of an embodiment of an apparatus for measuring resistance according to the present invention.

The apparatus for measuring resistance according to the present invention is not limited to the circuit shown in FIG. 2, and it is obvious that other well-known circuits may be used instead. For example, while two switches are used in FIG. 2 to switch the AC circuit (contact detecting circuit) and the DC circuit (IR measuring circuit), the detection of contact may be carried out by causing the AC signal to flow through the DC circuit in a superimposed relationship. Further, while an RMS-DC converter was used to convert an AC output signal into a DC signal corresponding to the RMS value thereof during the detection of contact, the present invention is not limited thereto. In addition, the detection of contact is not limited to the use of an AC signal and may be carried out by using a DC signal and by detecting a rush current thereof.

Although a pair of measuring terminals are used in the above-described embodiment, two or more pairs of measuring terminals may be used to ensure the contact with an electronic component. Similarly, two or more pairs of contact electrodes may be provided.

Referring to FIG. 4, after precharging is performed, the measurement of insulation resistance (including the detection of contact) is carried out at a separate step. The present invention is not limited thereto, and the charging and the measurement of insulation resistance (including the detection of contact) may be carried out simultaneously as disclosed in Japanese unexamined patent publication No. H4-254769.

As apparent from the above description, according to the present invention, contact of measuring terminals is detected by detecting the capacity of a parallel circuit formed by an electronic component to be measured and a dummy capacitor. As a result, even if the electronic component has a small capacity, the parallel circuit formed by the electronic component and the dummy capacitor provides a sufficient output if the dummy capacitor has a capacity required for the detection of contact. Thus, the contact can be detected with reliability.

This allows reliable detection of the contact of a capacitor of a small capacity or an electronic component having no capacity at all, which has been difficult in the prior art.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An apparatus for measuring characteristics of an electronic component having an electrostatic capacitance by putting measuring terminals in contact with electrodes of the electronic component to detect a current flowing through the electronic component, comprising:

a dummy capacitor;

connection means for connecting said measuring terminals, said dummy capacitor and said electrodes of said electronic component in a parallel circuit;

voltage application means for applying a voltage to said parallel circuit, wherein said voltage application means including means for applying an AC or DC signal to said parallel circuit formed by the electronic component and the dummy capacitor; and current detection means for detecting a current flowing through said parallel circuit and for determining a characteristic of said electronic component from said current, said current detection means including means for detecting the contact between the electrodes of the electronic component and the measuring terminals from the current flowing therethrough.

2. The apparatus for measuring characteristics of an electronic component according to claim 1, wherein said current detection means includes means for determining an insulation resistance of said electronic component from the current flowing therethrough.

3. The apparatus for measuring the characteristics of an electronic component according to claim 1 wherein:

said voltage application means includes means for applying an AC signal to said parallel circuit when it is desired to detect proper contact between the electrodes of the electronic component and the measuring terminals and for applying a DC signal to said parallel circuit when it is desired to measure a resistance $R_m$ of said electronic component; and said detection means includes means for detecting the contact between the electrodes of the electronic component and the measuring terminals from the current flowing through said parallel circuit when said voltage application means applies an AC signal to said parallel circuit and includes an IR measuring circuit for measuring a resistance R of the parallel circuit from the current therethrough when the voltage application means applies a DC signal to said parallel circuit; said resistance Rm of the electronic component being obtained from said resistance R and an insulation resistance Rd of the dummy capacitor using an equation:

$$Rm = R \cdot Rd/(Rd-R).$$

4. The apparatus for measuring characteristics of an electronic component according to any of claims 1, 2 and 3, comprising:

a transporting device driven for rotation in one direction;

a retaining groove provided on an upper surface of said transporting device for containing and retaining an electronic component; and a pair of contact electrodes provided on the bottom of said retaining groove such that they can contact electrodes of the electronic component, wherein said measuring terminals are provided above said transporting device such that they can be elevated and lowered, and said dummy capacitor is integrally incorporated in said transporting device, and said contact electrodes and the electrodes of said dummy capacitor are connected to each other.

5. The apparatus for measuring characteristics of an electronic component according to any of claims 1, 2 and 3, comprising:

a transporting device driven for rotation in one direction;

a retaining groove provided on an upper surface of said transporting device for containing and retaining an electronic component;

a pair of contact electrodes provided on the bottom of said retaining groove such that they can contact electrodes of the electronic component and extended to a lower surface of said transporting device; and an urging device provided above said transporting device such that it can be elevated and lowered, for urging the electronic component contained in the retaining groove to put electrodes of the electronic component in contact with the contact electrodes, wherein said measuring terminals are provided under said transporting device such that they can contact the contact electrodes, and said dummy capacitor is integrally incorporated in the urging device such that the terminals thereof can contact the electrodes of the electronic component.

6. An apparatus for measuring characteristics of an electronic component according to claim 1, wherein said component is a capacitor and said dummy capacitor has insulation resistance which is equal to or higher than one-tenth the insulation resistance of said electronic component.

* * * * *